United States Patent
Sakai

(12) United States Patent (10) Patent No.: US 8,003,547 B2
Sakai (45) Date of Patent: Aug. 23, 2011

(54) METHOD OF MANUFACTURING SEMICONDUCTOR DEVICE

(75) Inventor: Masanori Sakai, Takaoka (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 12/850,863

(22) Filed: Aug. 5, 2010

(65) Prior Publication Data

US 2011/0033956 A1 Feb. 10, 2011

(30) Foreign Application Priority Data

Aug. 7, 2009 (JP) ................................ 2009-185110
Jul. 12, 2010 (JP) ................................ 2010-157482

(51) Int. Cl.
*H01L 21/31* (2006.01)
(52) U.S. Cl. ........ 438/778; 438/779; 438/782; 438/783; 438/E21.487
(58) Field of Classification Search .................. 438/689, 438/745, 778, 782, 787
See application file for complete search history.

(56) References Cited

U.S. PATENT DOCUMENTS 6,008,143 A * 12/1999 Yu et al. ................. 438/778
2009/0061648 A1 * 3/2009 Horii et al. ............. 438/778

FOREIGN PATENT DOCUMENTS

JP 09-186107 7/1997
JP 2007-109865 4/2007

* cited by examiner

*Primary Examiner* — Dung A. Le
(74) *Attorney, Agent, or Firm* — Brundidge & Stanger, P.C.

(57) ABSTRACT

A substrate processing apparatus, a method of manufacturing a semiconductor device, and a method of confirming an operation of a liquid flowrate control device are provided. The substrate processing apparatus comprises: a process chamber accommodating a substrate; a liquid source supply system supplying a liquid source into the process chamber; a solvent supply system supplying a solvent having a vapor pressure greater than that of the liquid source into the process chamber; a liquid flowrate control device controlling flowrates of the liquid source and the solvent; and a controller controlling the liquid source supply system, the solvent supply system, and the liquid flowrate control device so that the solvent is supplied into the liquid flowrate control device than the solvent supply system to confirm an operation of the liquid flowrate control device before the liquid source supply system supplies the liquid source into the process chamber.

1 Claim, 8 Drawing Sheets

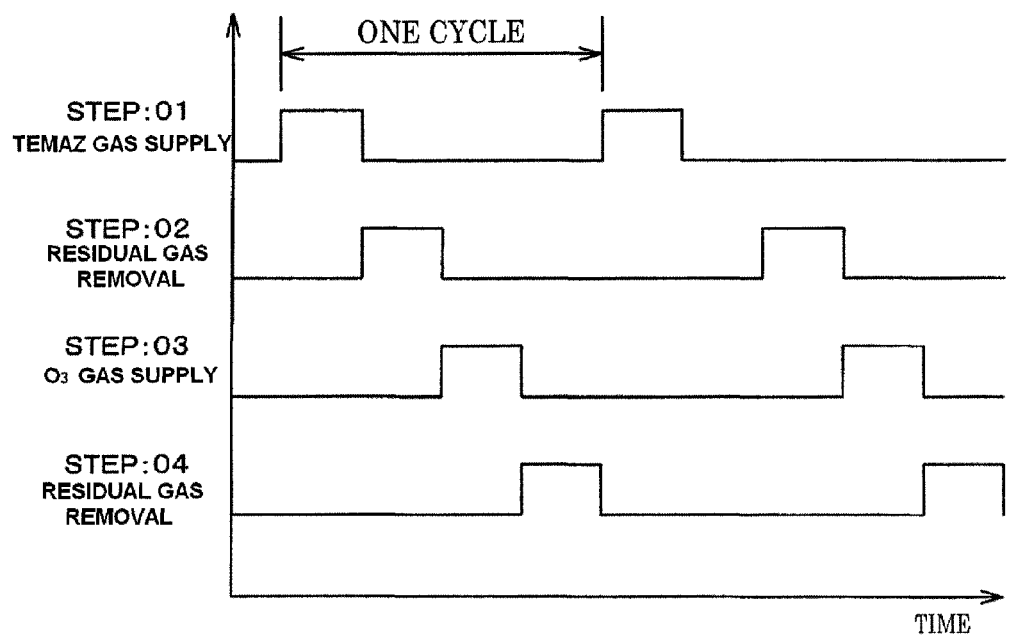

METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application Nos. 2009-185110, filed on Aug. 7, and 2010-157482, filed on Jul. 12, 2010, in the Japanese Patent Office, the entire contents of which are hereby incorporated by reference.

BACKGROUND OF THE INVENTION

1. Field of the Invention

The present invention relates to a substrate processing apparatus, a method of manufacturing a semiconductor device, and a method of confirming an operation of a liquid flowrate control device, which are adapted to manufacture a semiconductor device by performing processes such as a thin film forming process, an oxidation process, an impurity diffusion process, an annealing process, and an etching process on a substrate such as a silicon wafer.

2. Description of the Related Art

In a substrate processing process, a liquid mass flow controller and a vaporizer are used to perform a film forming process in which a liquid source is supplied while vaporizing to form a thin film on a substrate. For example, when a zirconium oxide film is formed, tetrakis ethylmethyl amino zirconium (TEMAZ) is used as a Zr source and ozone ($O_3$) is used as an oxygen source. However, TEMAZ is a liquid at ordinary temperatures and pressures (room temperature), and is supplied into the vaporizer by the control of the liquid mass flow controller. Then, the TEMAZ is vaporized in a vaporizer chamber inside the vaporizer to supply the vaporized TEMAZ gas together with an inert gas of a carrier into a reaction chamber as gas.

Among substrate processing apparatuses, in a batch type apparatus in which fifty sheets to hundred fifty sheets of substrate are processed at one time, it is necessary to supply a relatively large amount of TEMAZ. As a method for supplying a large amount of gas, a source tank itself may be heated to increase a vapor pressure. However, since the TEMAZ is a material that can be easily thermal-decomposed, it is difficult to heat the source tank for a long time. In addition, since the TEMAZ is a liquid having a low vapor pressure, it is difficult to obtain a sufficient flowrate using only its own vapor pressure without heating.

As a result, the TEMAZ is used through a method using the vaporizer in which the TEMAZ is in a liquid state at room temperature within the source tank and is vaporized by heat only in the vaporizer.

In such a TEMAZ supply system, a solvent supply system is provided also. When a line member through which the liquid TEMAZ passes is replaced, since the TEMAZ has a low vapor pressure, it is actually impossible to remove the source using only vacuum exhaust and $N_2$ purge. Thus, a solvent having a vapor pressure greater than that of the TEMAZ even though it is in a liquid state at room temperature, for example, normal hexane (n-Hexane) flows to downwash the TEMAZ, thereby performing a line cleaning process. The n-Hexane does not react with the TEMAZ and melts the TEMAZ. In addition, the n-Hexane is easily evaporated because it does not react with components of the atmosphere.

FIG. 6 is a graph illustrating a saturated vapor pressure curve of TEMAZ and n-Hexane. The TEMAZ has 0.004 Torr at a temperature of 30° C., and the n-Hexane has about 180 Torr at a temperature of 30° C. As a result, it may be seen that the TEMAZ and the n-Hexane have a four-digit or more vapor pressure difference therebetween.

In a related art substrate processing apparatus, when a liquid mass flow controller is used firstly (including also when the liquid mass flow controller is used firstly after being replaced), it is necessary to confirm an operation state of the liquid mass flow controller in a state where the liquid mass flow controller is installed in a batch type apparatus. However, for confirming the operation state of the liquid mass flow controller, when the TEMAZ as a source flows actually, in case where non-restorable defects exist in the liquid mass flow controller, the liquid mass flow controller should be replaced. In addition, since processes such as a liquid removal process→a purge process→a cleaning process using the solvent→a purge process are required, it takes a long work time.

Also, although the cleaning process is performed with a sufficient time and a deliberate sequence, since there is a chance that a slight amount of liquid remains, it may be possible that the pipe may be contaminated by the reaction between atmosphere and the residual source during replacement works.

SUMMARY OF THE INVENTION

An object of the present invention is to provide a substrate processing apparatus in which an operation of a liquid flowrate control device is confirmed using a high volatile solvent having a high vapor pressure when the liquid flowrate control device is initially adjusted, and processes required in case where defects of the liquid flowrate control device are detected are reduced, and simultaneously, contamination due to the residual liquid source is prevented, a method of manufacturing a semiconductor device, and a method of confirming the operation of the liquid flowrate control device.

According to an aspect of the present invention, there is provided a substrate processing apparatus comprising: a process chamber accomodating a substrate; a liquid source supply system supplying a liquid source which is a liquid at room temperature and atmospheric pressure into the process chamber; a solvent supply system supplying a solvent having a vapor pressure greater than that of the liquid source into the process chamber; a liquid flowrate control device controlling flowrates of the liquid source and the solvent; and a controller controlling the liquid source supply system, the solvent supply system, and the liquid flowrate control device, wherein the controller controls the liquid source supply system, the solvent supply system, and the liquid flowrate control device so that the solvent is supplied into the liquid flowrate control device than the solvent supply system to confirm an operation of the liquid flowrate control device before the liquid source supply system supplies the liquid source into the process chamber by disposing the liquid flowrate control device therebetween.

According to another aspect of the present invention, there is provided a method of method of manufacturing a semiconductor device, the method comprising: supplying a solvent into a liquid flowrate control device connected to a process chamber; monitoring the liquid flowrate control device to measure a flowrate of the solvent flowing into the liquid flowrate control device; comparing the measured flowrate of the solvent to a predetermined threshold value; removing the solvent from the process chamber when the flowrate of the solvent is in a range of the predetermined threshold value; vaporizing a liquid source supplied by disposing the liquid flowrate control device to supply the vaporized gas into the process chamber; and alternately supplying an reaction gas reacting with the vaporized gas to form a predetermined film on a surface of a substrate placed in the process chamber.

According to another aspect of the present invention, there is provided a method of confirming an operation of a liquid flowrate control device, the method comprising: supplying a solvent into a liquid flowrate control device connected to a process chamber; monitoring the liquid flowrate control device to measure a flowrate of the solvent flowing into the liquid flowrate control device; comparing the measured flowrate of the solvent to a predetermined threshold value; and removing the solvent from the process chamber when the flowrate of the solvent is in a range of the predetermined threshold value.

BRIEF DESCRIPTION OF THE DRAWINGS

FIG. 8 is a sequence diagram illustrating a cycle of a film forming process of a substrate according to the present invention.

DETAILED DESCRIPTION OF THE PREFERRED EMBODIMENTS

Preferable embodiments of the present invention will be described hereinafter with reference to the attached drawings.

Figure 1:
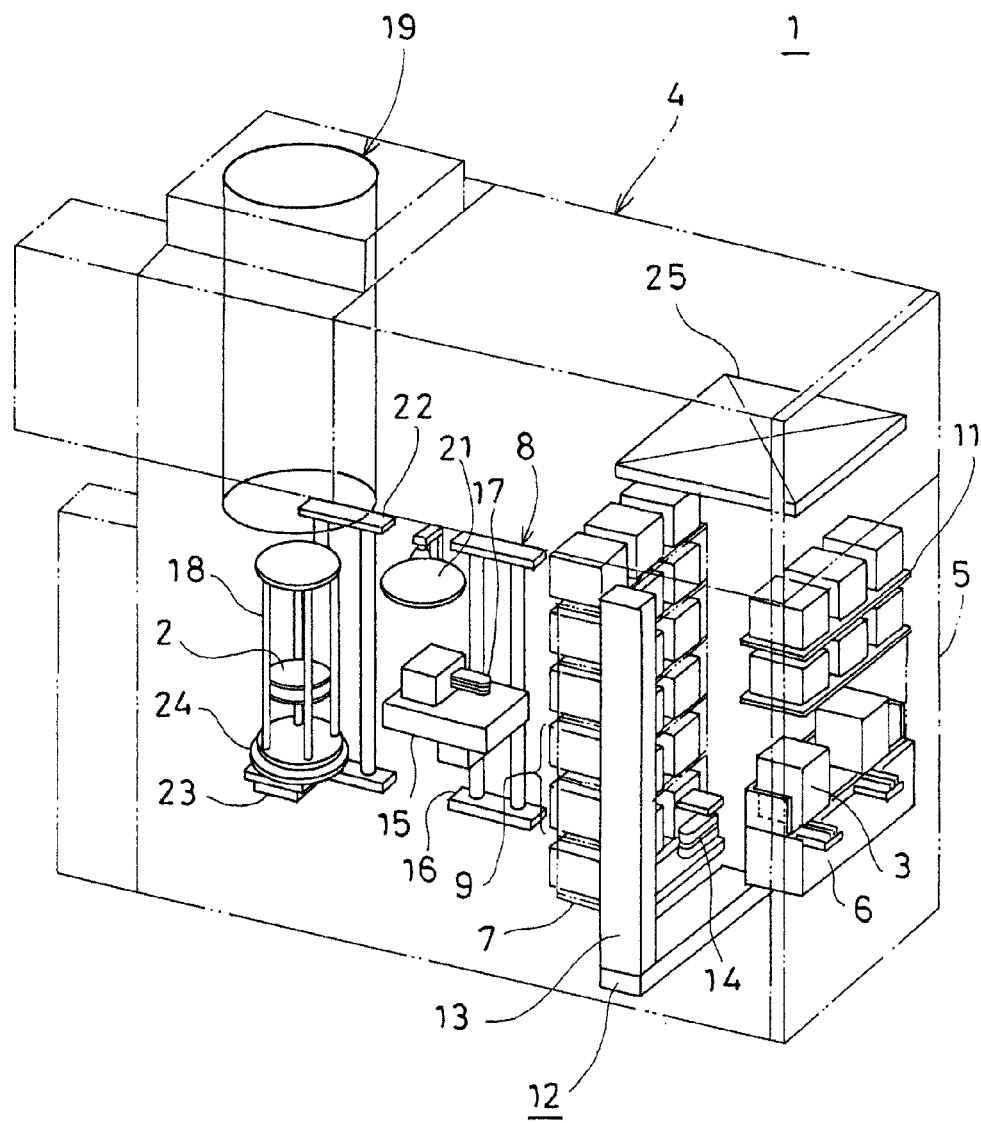
FIG. 1 is a schematic perspective view of a substrate processing apparatus according to the present invention.

First, with reference to FIG. 1, a substrate processing apparatus 1 according to an embodiment of the present invention will be described.

The substrate processing apparatus 1 of the present invention, in which cassettes 3 are used as wafer carriers for accommodating wafers (substrates) 2 made of a material such as silicon, includes a housing 4. A front maintenance entrance (not shown) is formed in the lower side of a front wall 5 of the housing 4 as an opening for maintenance works, and a front maintenance door (not shown) is vertically installed to open and close the front maintenance entrance. A cassette carrying port (substrate container carrying port) (not shown) is formed in the front maintenance door so as to communicate with the inside and outside of the housing 4. At the inside of the cassette carrying port of the housing 4, a cassette stage (substrate container stage) 6 is installed. The cassettes 3 are carried onto the cassette stage 6 and carried away from the cassette stage 6, by an in-process carrying device (not shown).

On the cassette state 6, by the in-process carrying device, the wafers 2 inside the cassette 3 are vertically positioned, and a wafer taking in/out entrance of the cassette 3 is placed facing upward. The cassette stage 6 is configured so that the cassette 3 is rotated by 90° counterclockwise in a longitudinal direction toward the backward of the housing 4, the wafers 2 inside the cassette 3 are horizontally positioned, and the wafer taking in/out entrance of the cassette 4 faces the backward of the housing 4.

At an approximately central part of the housing 4 in a front-to-back direction, a cassette shelf (substrate container shelf) 7 is installed. The cassette shelf 7 is configured so that the plurality of cassettes 3 is stored in a plurality of stages and a plurality of rows. At the cassette shelf 7, a transfer shelf 9 is installed to store the cassette 3, which is a carrying object of a wafer transfer mechanism (described later) 8. Also, at the upside of the cassette stage 6, a standby cassette shelf 11 is installed to store standby cassettes 3.

Between the cassette stage 6 and the cassette shelf 7, a cassette carrying device (substrate container carrying device) 12 is installed. The cassette carrying device 12 is configured by a cassette elevator (substrate container elevating mechanism) 13, which is capable of moving upward and downward while holding the cassette 3 and a cassette carrying mechanism (substrate container carrying mechanism) 14 as a carrying mechanism. By continuous motions of the cassette elevator 13 and the cassette carrying mechanism 14, the cassette carrying device 12 is designed to carry the cassette 3 among the cassette stage 6, the cassette shelf 7, and the standby cassette shelf 11.

At the backside of the cassette shelf 7, the wafer transfer mechanism (substrate transfer mechanism) 8 is installed. The wafer transfer mechanism 8 is configured by a wafer transfer device (substrate transfer device) 15 that is capable of rotating or linearly moving the wafer 2 in a horizontal direction and a wafer transfer device elevator (substrate transfer device elevating mechanism) 16 for moving the wafer transfer device 15 upward or downward. By continuous motions of the wafer transfer device 15 and the wafer transfer device elevator 16, the wafer 2 is picked by tweezers (substrate holder) 17 of the wafer transfer device 15 and is charged into a boat (substrate holding tool) 18 and discharged from the boat 18.

At the upside of the rear part of the housing 4, a process furnace 19 is installed.

The lower end part of the process furnace 19 is configured so as to be opened and closed by a furnace port shutter (furnace port opening/closing mechanism) 21.

At the downside of the process furnace 19, a boat elevator (substrate holding tool elevating mechanism) 22 is installed to move the boat 18 upward to and downward from the process furnace 19. At an arm 23 as a connecting unit connected to an elevating table of the boat elevator 22, a seal cap 24 as a cover part is horizontally installed. The seal cap 24 vertically supports the boat 18 and is configured to block the lower end part of the process furnace 19.

The boat 18 includes a plurality of holding members and is configured to horizontally hold a plurality of wafers (for example, about fifty to one hundred fifty wafers) in a state where the centers of the wafers 2 are aligned and arranged in a vertical direction.

At the upside of the cassette shelf 7, a cleaning unit 25 configured by a supply fan and a dust filter is installed to supply clean air as purified atmosphere, so that the clean air may flow inside of the housing 4.

Also, at the left side end part of the housing 4 opposite to the wafer transfer device elevator 16 and the boat elevator 22, another cleaning unit (not shown) configured by a supply fan and a dust filter is installed to supply clean air. Thus, the clean air is blown from the cleaning unit (not shown) to the wafer transfer device 15 and the boat 18, and after passing through the wafer transfer device 15 and the boat 18, the clean air is sucked by an exhaust device (not shown) and discharged to the outside of the housing 4.

Next, an operation of the substrate processing apparatus 1 will be described.

The cassette 3 is placed on the cassette stage 6 through a cassette carrying port (not shown) in a state where the wafers are vertically positioned in the cassette 3 and the wafer taking in/out entrance of the cassette 3 faces upward. Thereafter, the cassette 3 is rotated 90° counterclockwise in a longitudinal direction toward the backward of the housing 4 by the cassette state 6 so that the wafers 2 inside the cassette 3 are horizontally positioned and the wafer taking in/out entrance of the cassette 3 faces the backward of the housing 4.

Next, the cassette 3 is automatically carried and placed by the cassette carrying device 12 to a specified shelf position of the cassette shelf 7 or the standby cassette shelf 11 so as to be temporarily stored, and then transferred from the cassette shelf 7 or the standby cassette shelf 11 to the transfer shelf 9 by the cassette carrying device 12, or directly transferred to the transfer shelf 9.

After the cassette 3 is transferred to the transfer shelf 9, the wafer 2 is picked up from the cassette 3 through the wafer taking in/out entrance and is charged into the boat 18 disposed at the backward of the transfer shelf 9 by the tweezers 17 of the wafer transfer device 15. After delivering the wafer 2 to the boat 18, the wafer transfer device 15 returns to the cassette 3, and then charges the next wafer 2 into the boat 18.

After a predetermined number of wafers 2 is charged into the boat 18, the lower end of the process furnace 19 closed by the furnace port shutter 21 is opened by moving the furnace port shutter 21. Subsequently, the boat 18 holding the wafers 2 is loaded into the process furnace 19 by lifting the seal cap 24 using the boat elevator 22. After the loading, a predetermined heat treatment is performed on the wafers 2 inside the process furnace 19. Thereafter, the wafers 2 and the cassette 3 are carried out to the outside of the housing 4 in a reverse sequence of the above.

Next, with reference to FIGS. 2 and 3, the process furnace 19 applied to the substrate processing apparatus 1 will be described. Also, the same part in FIGS. 2 and 3 as in FIG. 1 will be designated by the same reference numeral, and description thereof will be omitted.

Inside a heater 26 which is a heating device (heating unit), a reaction tube 27 as a reaction vessel is installed to process the wafers (substrates) 2. At the lower end of the reaction tube 27, for example, a manifold 28 made of stainless steel is installed, and at the lower end part of the manifold 28, the seal cap 23 as a furnace port cap is installed. The seal cap 24 is, for example, a disk-shaped member made of a metal such as stainless steel. On the top surface of the seal cap 24, an O-ring 29 is installed as a seal member that is in contact with the lower end of the manifold 28. The seal cap 24 air-tightly closes a lower end opening of the manifold 28 by disposing the O-ring 29 therebetween. Also, a process chamber is constituted by at least the reaction tube 27, the manifold 28, and the seal cap 24.

At the seal cap 24, the boat 18 is erected by disposing the boat support stand 32 between the seal cap 24 and the boat 18. The boat support stand 32 is a holder which is used to hole the boat 18. The boat 18 is inserted in the process chamber 31. At the boat 18, a plurality of wafers 2 to be batch-processed is held in a horizontal position and is vertically piled in multiple stages. Also, the heater 26 heats the wafers 2 inserted into the process chamber 31 to a predetermined temperature.

At the process chamber 31, a first gas supply pipe 33 and a second gas supply pipe 34 are installed as supply passages for supplying a plurality of processing gases (in the current embodiment, two kinds of processing gases). At the first gas supply pipe 33, a liquid mass flow controller 35 which is a flowrate control device (flowrate control unit), a vaporizer 36, and a first valve 37 which is an on/off valve are sequentially installed in an upstream direction, and a first carrier gas supply pipe 38 for supplying carrier gas is jointed with the first valve 37. At the first carrier gas supply pipe 38, a second mass flow controller 39 which is a flowrate control device (flowrate control unit) and a third valve 41 which is an on/off valve are sequentially installed in an upstream direction.

Also, at the front end part of the first gas supply pipe 33, in an arc-shaped space between an inner wall of the reaction tube 27 constituting the process chamber 31 and the wafers 2, a first nozzle 43 is installed from a lower port to an upper part of the inner wall of the reaction tube 27 along the piled direction of the wafers 2. In a lateral surface of the first nozzle 43, a first gas supply hole 44 for supplying gas is formed. The first gas supply hole 44 has the same open area and is formed at the same pitch from the lower side to the upper side. Mainly, a first gas supply system (in case where a source material supplied from the first gas supply pipe 33 is liquid, a liquid source supply system) is constituted by the first gas supply pipe 33, the liquid mass flow controller 35, the vaporizer 35, the first valve 37, and the first nozzle 43.

At the second gas supply pipe 34, a first mass flow controller 45 which is a flowrate control device (flowrate control unit) and a second valve 46 which is an on/off valve are sequentially installed in an upstream direction, and a second carrier gas supply pipe 47 for supplying carrier gas is jointed with the second valve 46. At the second carrier gas supply pipe 47, a third mass flow controller 48 which is a flowrate control device (flowrate control unit) and a fourth valve 49 which is an on/off valve are sequentially installed in an upstream direction.

Also, at the front end part of the second gas supply pipe 34, in the arc-shaped space between the inner wall of the reaction tube 27 constituting the process chamber 31 and the wafers 2, a second nozzle 51 is installed from a lower port to an upper part of the inner wall of the reaction tube 27 along the piled direction of the wafers 2. In a lateral surface of the second nozzle 51, a second gas supply hole 52 for supplying gas is formed. The second gas supply hole 52 has the same open area and is formed at the same pitch from the lower side to the upper side. Mainly, a second gas supply system (in case where reaction gas reacting with the source material is supplied, a reaction gas supply system) is constituted by the second gas supply pipe 34, the first mass flow controller 45, the second valve 46, and the second nozzle 51.

For example, when a source material supplied from the first gas supply pipe 33 is liquid, the liquid mass flow controller 35, the vaporizer 36, and the first valve 37 are sequentially installed from the first gas supply pipe 33, and the first gas supply pipe 33 is jointed with the first carrier gas supply pipe 38, and furthermore, the first nozzle 43 is installed therebetween to supply source gas into the process chamber 31. For example, when a source material supplied from the first gas supply pipe 33 is gas, the liquid mass flow controller 35 is replaced with a gas mass flow controller, and thus, the vaporizer 36 is unnecessary. Also, the first mass flow controller 45 and the second valve 46 are sequentially installed from the second gas supply pipe 34, and the second gas supply pipe 34 is joint with the second carrier gas supply pipe 47, and furthermore, the second nozzle 51 is installed therebetween to supply the reaction gas reacting with the source material supplied from the first gas supply pipe 33 into the process chamber 31.

Also, at the process chamber 31, a gas exhaust pipe 53 is installed to exhaust the inside atmosphere of the process chamber 31. At the gas exhaust pipe 53, a pressure sensor 62 as a pressure detector (pressure detecting unit) configured to regulate the inner pressure of the process chamber 31 is installed, and simultaneously, an auto pressure controller (APC) valve (fifth valve) 54 as a pressure regulator (pressure regulating unit) is installed and connected to a vacuum pump 55 which is an exhaust device (exhaust unit), so that the inside of the process chamber 31 is vacuum-evacuated to a predetermined pressure (vacuum degree). The APC valve 54 is an on/off valve, which may be opened and closed to stop the vacuum evacuation of the inside of the process chamber 31 and may adjust the inner pressure by adjusting a degree of valve opening. Mainly, an exhaust system is constituted by the gas exhaust pipe 53, the APC valve 54, the vacuum pump 55, and the pressure sensor 62.

Also, the arc-shaped space between the inner wall of the reaction tube 27 inside the process chamber 31 and the wafers 2, an L-shaped temperature sensor 63 is installed as a temperature detector extending from a lower side of the reaction tube 27 along the inner wall of the reaction tube 27. Thus, based on temperature information detected by the temperature sensor 63, the electrified state of the heater 26 is controlled in order that the inside of the process chamber 31 is made to have a desired temperature distribution.

At the center part of the inside of the reaction tube 27, the boat 18 in which a plurality of wafers 2 are placed in multiple stages at the same intervals is installed, and the boat 18 may be loaded into and unloaded from the reaction tube 27 by the boat elevator 22. Also, at the lower side of the seal cap 24, a boat rotating mechanism 56 for rotating the boat 18 is installed to improve processing uniformity. A rotation shaft 64 of the boat rotating mechanism 56 passes through the seal cap 24 and is connected to the lower end of the boat support stand 32, so that the boat 18 held on the boat support stand 32 may be rotated by rotating the boat rotating mechanism 56.

The controller 57, which is a control unit, is electrically connected to the first to third mass flow controllers 45, 39, and 48, the first to fourth valves 37, 41, and 49, the APC valve 54, the heater 26, the vacuum pump 55, the boat rotating mechanism 56, the boat elevator 22, the pressure sensor 62, and the temperature sensor 63. Also, by the controller 57, flowrate adjusting operations of the liquid mass flow controller 35 and the first to third mass flow controllers 45, 39, and 48; opening and closing operations of the first to fourth valves 37, 46, 41, and 49; opening, closing, and pressure adjusting operations of the APC valve 54; a temperature adjusting operation of the heater 26; start and stop operations of the vacuum pump 55; a rotation speed adjusting operation of the boat rotating mechanism 56; and an elevating operation of the boat elevator 22 are controlled, and simultaneously, a flowrate detected by the liquid mass flow controller 35 and the first to third mass flow controllers 45, 39, and 48; a pressure inside the process chamber 31 detected by the pressure sensor 62; and a temperature inside the process chamber 31 inside the process chamber 31 detected by the temperature sensor 63 are regularly fed back.

Although not shown, the controller 57 includes a measuring part which measures the flowrate detected and fed back by the liquid mass flow controller 35, a memory in which a preset threshold is stored, and a comparing part which compares the measured value of the flowrate measured by the measurement to the threshold stored in the memory.

In the process furnace 19 in of the current embodiment, a high dielectric constant (high-k) film such as a $ZrO_2$ or hafnium $HFO_2$ film is formed. As the reaction material (film forming material), the $ZrO_2$ film may be formed using reaction materials such as tetrakis ethylmethyl amino zirconium (TEMAZ, $Zr(NEtME)_4$), $Zr(O-tBu)_4$, tetrakis dimethyl amido zirconium (TDMAZ, $Zr(NMe2)_4$), tetrakis diethyl amino zirconium (TEEAZ, $Zr(NEt2)4$) and the like. Also, the $HfO_2$ film may be formed using reaction materials such as tetrakis ethyl methyl amino hafnium (TEMAH, Hf $(NEtMe)_4$), $Hf(O-tBu)_4$, $Hf(NMe_2)_4$, $Hf(NEt_2)_4$, $Hf(MMP)_4$ and the like. Here, Me represents a methyl group ($CH_3$), Et represents an ethyl group ($C_2H_5$), and $Zr(O-tBu)_4$ represents $Zr(OC(CH_3)_3)_4$.

In addition to the above materials, it is possible to use amine-compound materials expressed by chemical formula $Xn(NR^1R^2)m$ (elements in III to V families, R1 and R2 indicate Me or Et, and n and m indicate natural numbers).

Hereinafter, an example of the film forming process using an atomic layer deposition (ALD) method as a kind of a chemical vapor deposition (CVD) method will be described based on an example for forming the $ZrO_2$ film using TRMAZ and $O_3$ which is one of manufacturing processes of a semiconductor device.

In the CVD method or the ALD method, for example, in the CVD method, a plurality of kinds of gases containing a plurality of elements that constitute a film to be formed are simultaneously supplied, and in the ALD method, a plurality of kinds of gases containing a plurality of elements that constitute a film to be formed are alternately supplied. Also, a silicon nitride film (SiN film) or a silicon oxide film (SiO film) is formed by controlling supply conditions such as the gas flowrates of the supply gases, the supply times of the supply gases, and plasma power. For example, in the case of forming the SiN film, the supply conditions are controlled so as to adjust the composition ratio of the SiN film to the stoichiometric composition of $N/Si \approx 1.33$, and in the case of forming the SiO film, the supply conditions are controlled so as to adjust the composition ratio of the SiO film to the stoichiometric composition of $O/Si \approx 2$.

Figure 7:
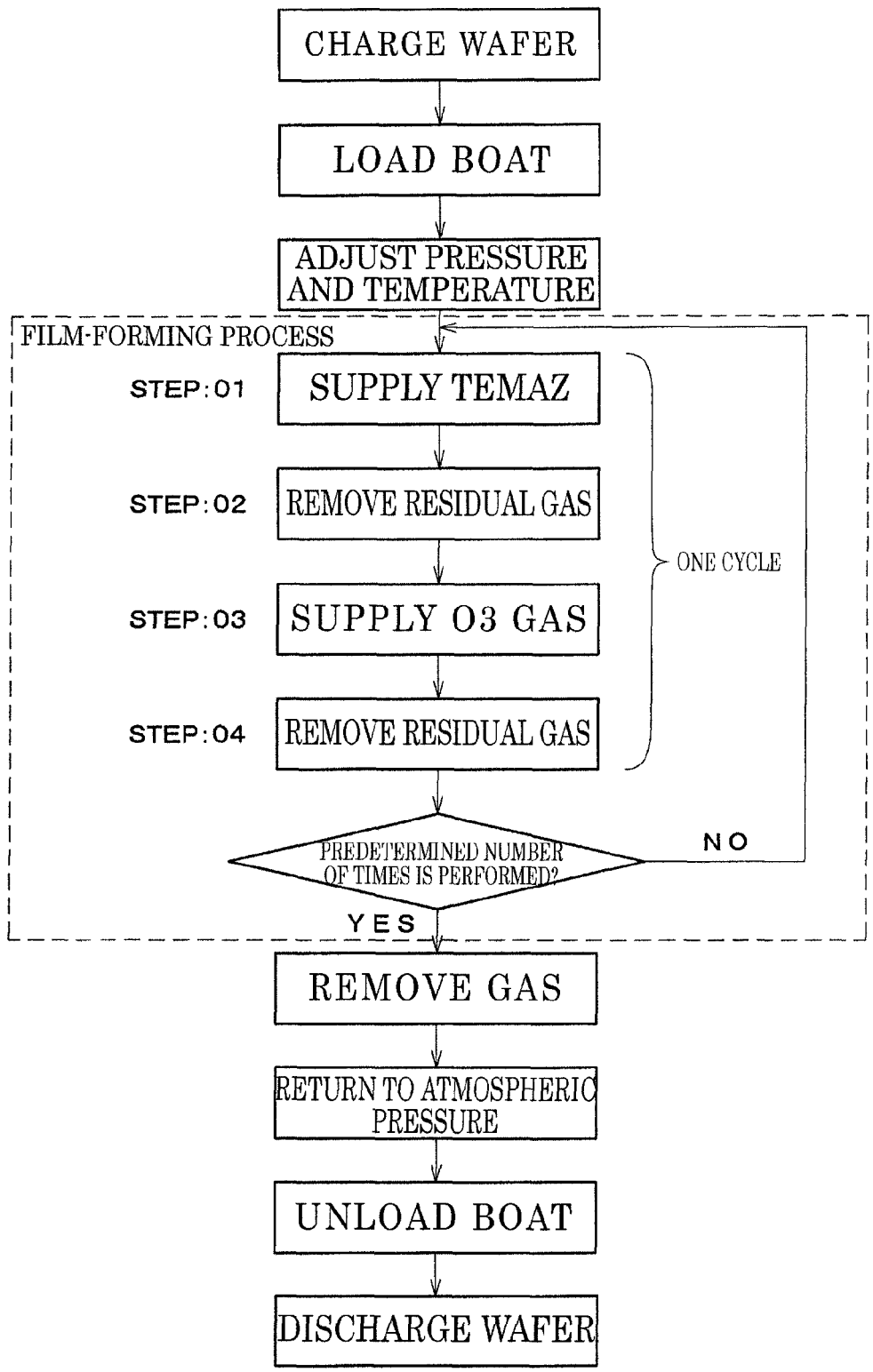
FIG. 7 is a flowchart of a substrate processing process according to the present invention.

In addition, the supply conditions may be controlled so that the composition ratio of the film to be formed is different from the stoichiometric composition. That is, the supply conditions may be controlled so that at least one of a plurality of elements constituting the film to be formed is excessive in amount as compared with other elements in terms of the stoichiometric composition. As described above, a process of forming a film may be performed while controlling the ratio of the plurality of elements constituting the film to be formed, that is, the composition ratio of the film. Hereinafter, with reference to a flow chart of FIG. 7 and a sequence diagram of FIG. 8, a process of forming a $ZrO_2$ film by the ALD method will be described.

In the ALD method, for example, when the $ZrO_2$ film is formed, high quality films may be formed at a low temperature of 150° C. to 250° C. using TEMAH and $O_3$.

Figure 2:
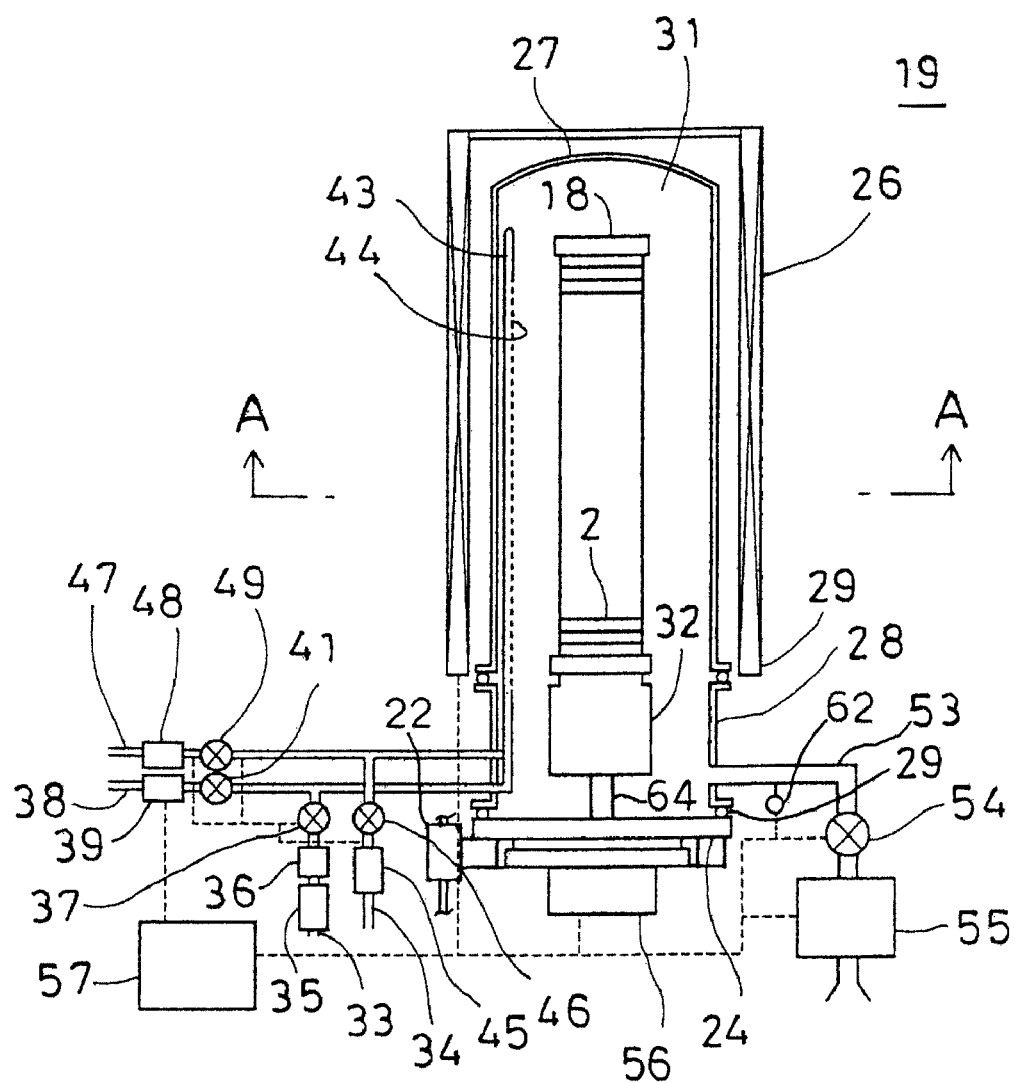
FIG. 2 is a longitudinal sectional view of a process furnace according to the present invention.
Figure 3:
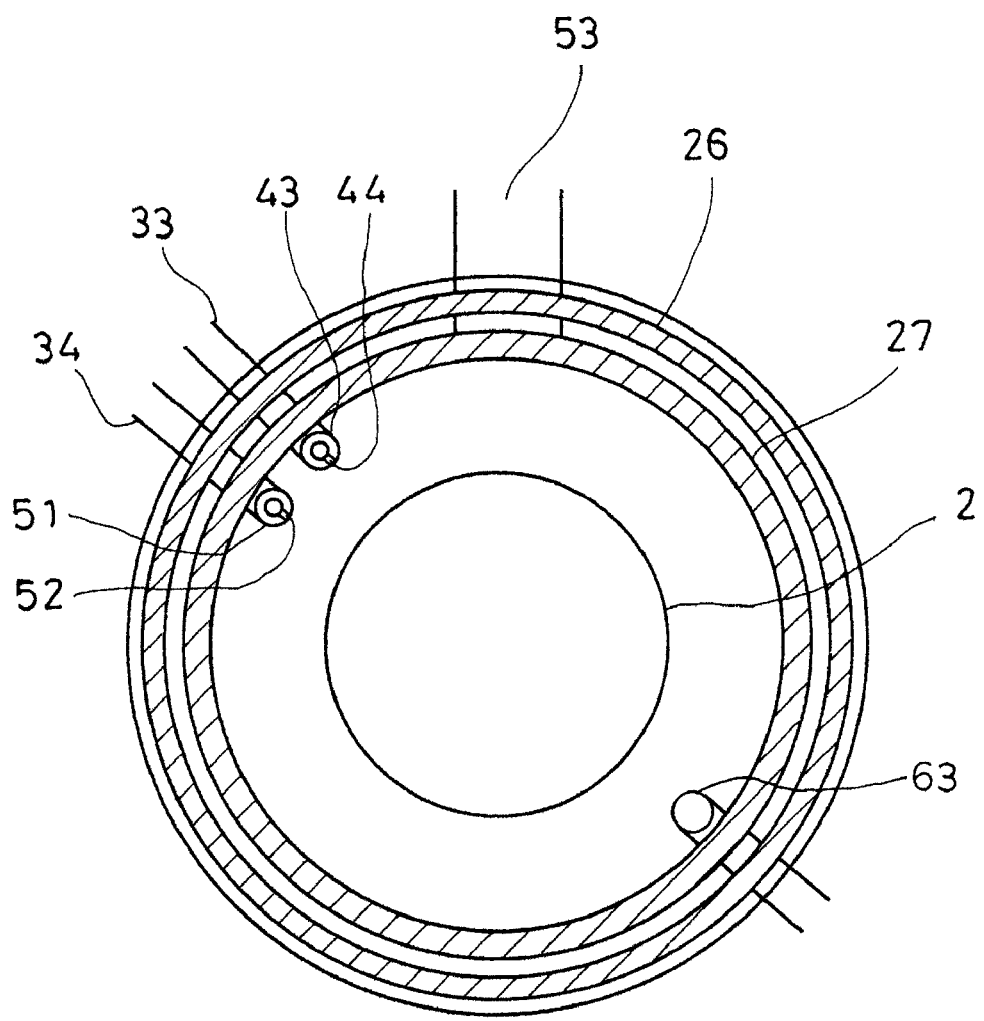
FIG. 3 is a perspective view taken along line A-A of FIG. 2.

First, as described above, when the wafers 2 are charged into the boat 18, as illustrated in FIG. 2, the boat 18 holding the wafers 2 is lifted by the boat elevator 22 and loaded into the process chamber 31. In this state, the seal cap 24 seals the lower end opening of the manifold 28 by disposing the O-ring 29 therebetween.

Next, the inside of the process chamber 31 is vacuum-exhausted to a desired pressure (vacuum degree) by the vacuum pump 55. At this time, the pressure inside the process chamber 31 is measured by the pressure sensor 62, and the APC valve 54 is feed-back controlled (pressure adjustment) based upon the measured pressure. Also, the inside of the process chamber 31 is heated by the heater 26 in order that the inside of the process chamber 31 is made to have a desired temperature distribution. In this case, based upon temperature information detected by the temperature sensor 63, the electrified state of the heater 26 is fed back. Subsequently, the boat 18 is rotated by the boat rotating mechanism 56, and therefore, the wafers 2 are rotated. In this state, the TEMAZ gas and $O_3$ gas are supplied into the process chamber 31 to form the $ZrO_2$ film. In the film forming process, four steps illustrated in the sequence diagram of FIG. 8 are sequentially executed.

STEP:01

Under the command of the controller 57, the TEMAZ flows into the first gas supply pipe 33, and carrier gas ($N_2$) flows into the first carrier gas supply pipe 38. At this time, the APC valve 54 of the gas exhaust pipe 53 is kept open.

Next, the first valve 37 and the third valve 41 are opened together. The carrier gas flows from the first carrier gas supply pipe 38, and a flowrate thereof is adjusted to a set value, which is set by the controller 57, by the second mass flow controller 39. The TEMAZ flows from the first gas supply pipe 33, and a flowrate thereof is adjusted to a set value, which is set by the controller 57, by the liquid mass flow controller 35. Then, the TEMAZ is vaporized by the vaporizer 36, mixed with carrier gas whose the flowrate is adjusted together, and the mixture is supplied into the process chamber 31 from the first gas supply hole 44 while it is exhausted from the gas exhaust pipe 53.

At this time, by appropriately adjusting the APC valve 54, the inside of the process chamber 31 is maintained at a pressure in the range of 10 Pa to 900 Pa, for example, 30 Pa. Also, a supply rate of the TEMAZ controlled by the liquid mass flow controller 35 is 0.1 g/min to 0.5 g/min. The wafers 2 are exposed to the TEMAZ gas for 1 second to 300 seconds. At this time, the temperature of the heater 26 is set so that the wafer temperature is in a range of 150° C. to 250° C., for example, 220° C. Then, by supplying the TEMAZ into the process chamber 31, a surface reaction (chemical adsorption) with a surface part such as an under-layer film on the wafer 2 occurs.

STEP:02

Next, the first valve 37 is closed, and the supply of TEMAZ is stopped.

In a state where the APC valve 54 is kept open, the gas is exhausted by the vacuum pump 55 until the inside of the process chamber 31 reaches to a pressure of 20 Pa or less, and the remaining TEMAZ gas is exhausted from the process chamber 31. At this time, when an inert gas such as $N_2$ or the like is supplied into the process chamber 31, the effect for eliminating the remaining TEMAZ gas may be further enhanced.

STEP:03

Next, the second valve 46 and the fourth valve 49 are opened together, and the carrier gas $N_2$ flows into the second carrier gas supply pipe 47. Then, the carrier gas flows from the second carrier gas supply pipe 47, and the flowrate thereof is adjusted to a set value, which is set by the controller 57, by the third mass flow controller 48. Also, $O_3$ gas flows from the second gas supply pipe 34, the flowrate thereof is adjusted by the third mass flow controller 48, the $O_3$ gas is mixed with the carrier gas whose a flowrate is adjusted together, and the mixture is supplied into the process chamber 31 from the second gas supply hole 52 while it is exhausted from the gas exhaust pipe 53.

At this time, by appropriately adjusting the APC valve 54, the inside of the process chamber 31 is maintained at a pressure in the range of 10 Pa to 900 Pa, for example, 66 Pa. The wafers 2 are exposed to the $O_3$ gas for 1 second to 300 seconds. Also, the temperature of the heater 26 is set so that the wafer temperature is in a range of 150° C. to 250° C., for example, 220° C. as in the supply operation of the TEMAZ gas in STEP:01. By supplying the $O_3$ gas, the $O_3$ gas and the TEMAZ gas which is chemically adsorbed on the surfaces of the wafers 2 react with each other, and the $ZrO_2$ film is formed on each of the wafers 2.

STEP:04

After the $ZrO_2$ film is formed, the second valve 46 and the fourth valve 49 are closed, and the inside of the process chamber 31 is vacuum-evacuated by the vacuum pump 55, and the remaining $O_3$ gas after the film formation is eliminated. At this time, when an inert gas such as $N_2$ and the like is supplied into the reaction tube 27, the effect for eliminating the remaining $O_3$ gas after the film formation from the process chamber 31 may be further enhanced.

The above-described STEP:01 to STEP:04 are defined as one cycle, and when this cycle is repeated a plurality of times, the ZrO2 films having a predetermined film thickness may be formed on the wafers 2.

When the film forming process for forming the $ZrO_2$ film having a predetermined thickness is performed, the inert gas such as $N_2$ gas and the like is supplied to the inside of the process chamber 31 and is exhausted from the inside of the process chamber 31 so as to purge the inside of the process chamber 31 by the inert gas (gas purge). Thereafter, the inside of the process chamber 31 returns to atmospheric pressure (return to atmospheric pressure).

After the inside of the process chamber 31 returns to atmospheric pressure, the seal cap 24 is moved downward by the boat elevator 22 so as to open the lower end of the manifold 28 and unload the boat 18 in which the processed wafers 2 are supported from the inside of the process chamber 31 (boat unloading). Finally, the processed wafers 2 are discharged from the boat 18 (wafer discharging) so as to complete a series of processes.

Figure 4:
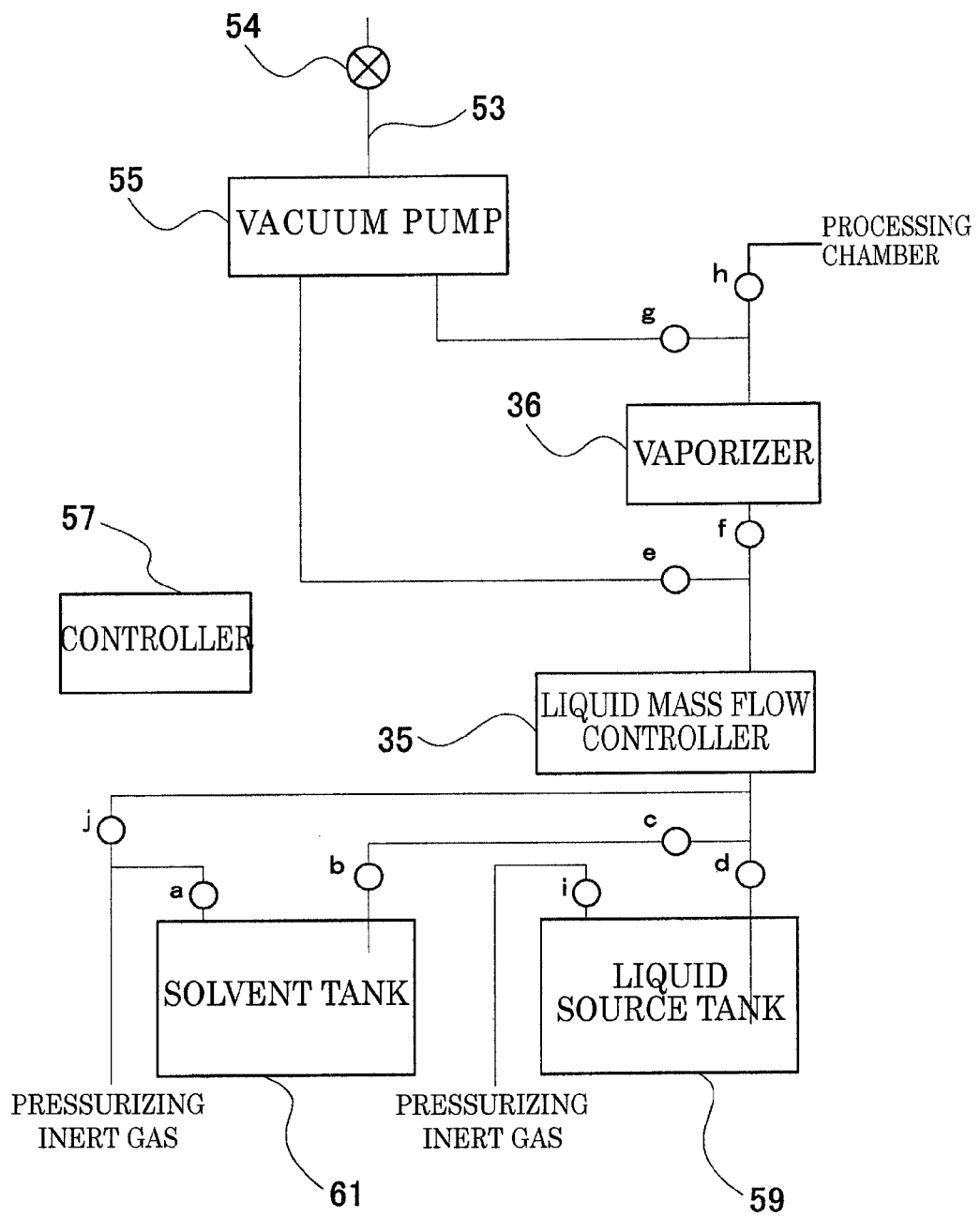
FIG. 4 is schematic configuration view illustrating a supply/exhaust system of a liquid source and solvent according to the present invention.

Next, with reference to FIG. 4, in the substrate processing apparatus 1 of the present invention, a schematic configuration of a supply/exhaust system of a liquid source and solvent will be described.

The supply/exhaust system includes a liquid source tank 59 containing TEMAZ, a solvent tank 61 containing a solvent such as n-Hexane which has a relatively high vapor pressure when compared to the TEMAZ and does not react with the TEMAZ, the liquid mass flow controller 35 adjusting a flowrate of the TEMAZ or solvent, the vaporizer 36 vaporizing the TEMAZ, and the vacuum pump 55 exhausting the remaining TEMAZ. The liquid source tank 59, the solvent tank 61, the liquid mass flow controller 35, the vaporizer 36, and the vacuum pump 55 are connected to each other by pipes.

Also, the vaporizer 36 is connected to the process chamber 31 (not shown) by disposing a pipe therebetween, and simultaneously, the liquid source tank 59 and the solvent tank 61 are connected to each other by disposing a pressurizing inert gas supply system (not shown and described) which supplies pressurizing inert gas such as $N_2$ and a pipe (not shown and described) therebetween. Thus, the liquid source tank 59 and the pressurizing inert gas supply system constitute a liquid source supply system, and the solvent tank 61 and the pressurizing inert gas supply system constitute a solvent supply system.

Also, in the pipe, valves a to j are installed at predetermined parts, and the valves a to j are electrically connected to the controller 57 so that a passage of the liquid source or solvent flowing into the pipe can be changed according to a command of the controller 57.

The flowrate control of the liquid source and solvent is performed by the pressurizing inert gas supplied from the pressurizing inert gas supply system (not shown), and the liquid mass flow controller 35 may be used as a liquid flowmeter which detects only the flowrate of the liquid.

In the current embodiment, in case where the liquid mass flow controller 35 is firstly used due to the replacement of the device, actually, for confirming an operation of the liquid mass flow controller 35 before the film forming process is performed, a process for confirming whether the liquid mass flow controller 35 is defective is executed.

Figure 5:
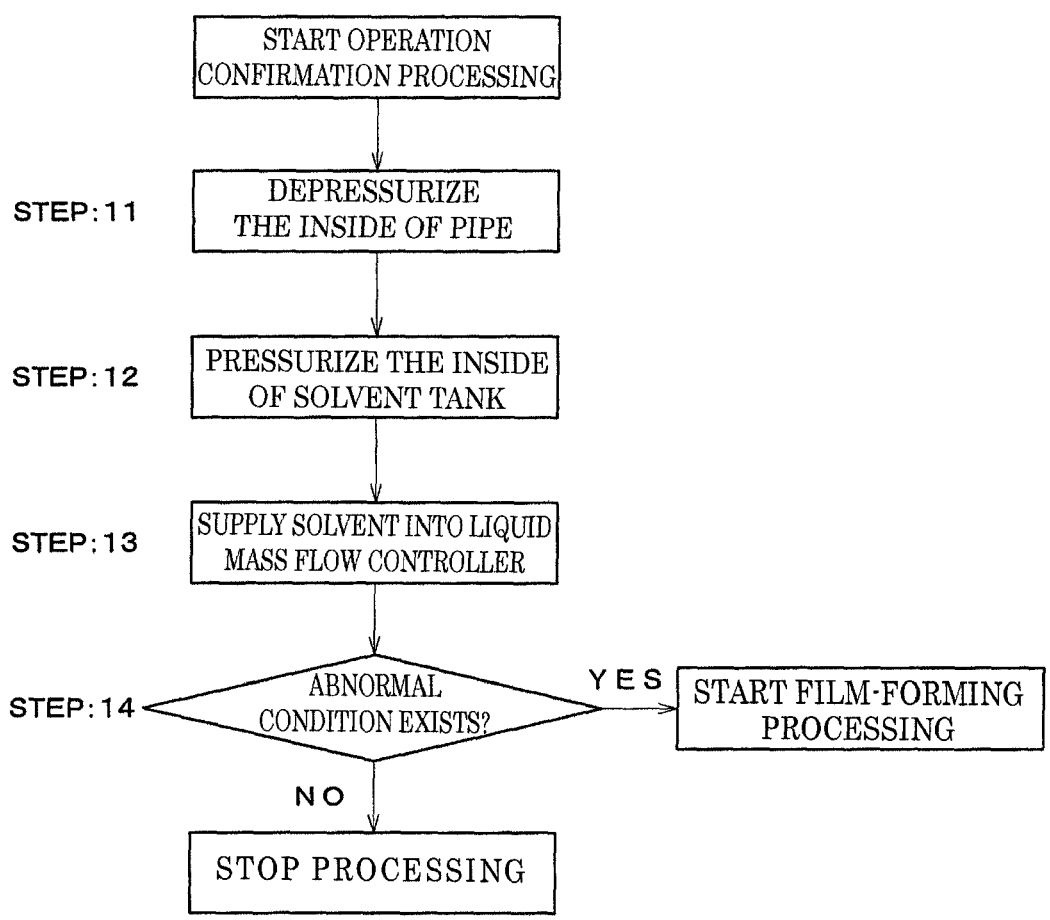
FIG. 5 is a flowchart illustrating a process for confirming an operation of a liquid flowrate control device according to the present invention.
Figure 6:
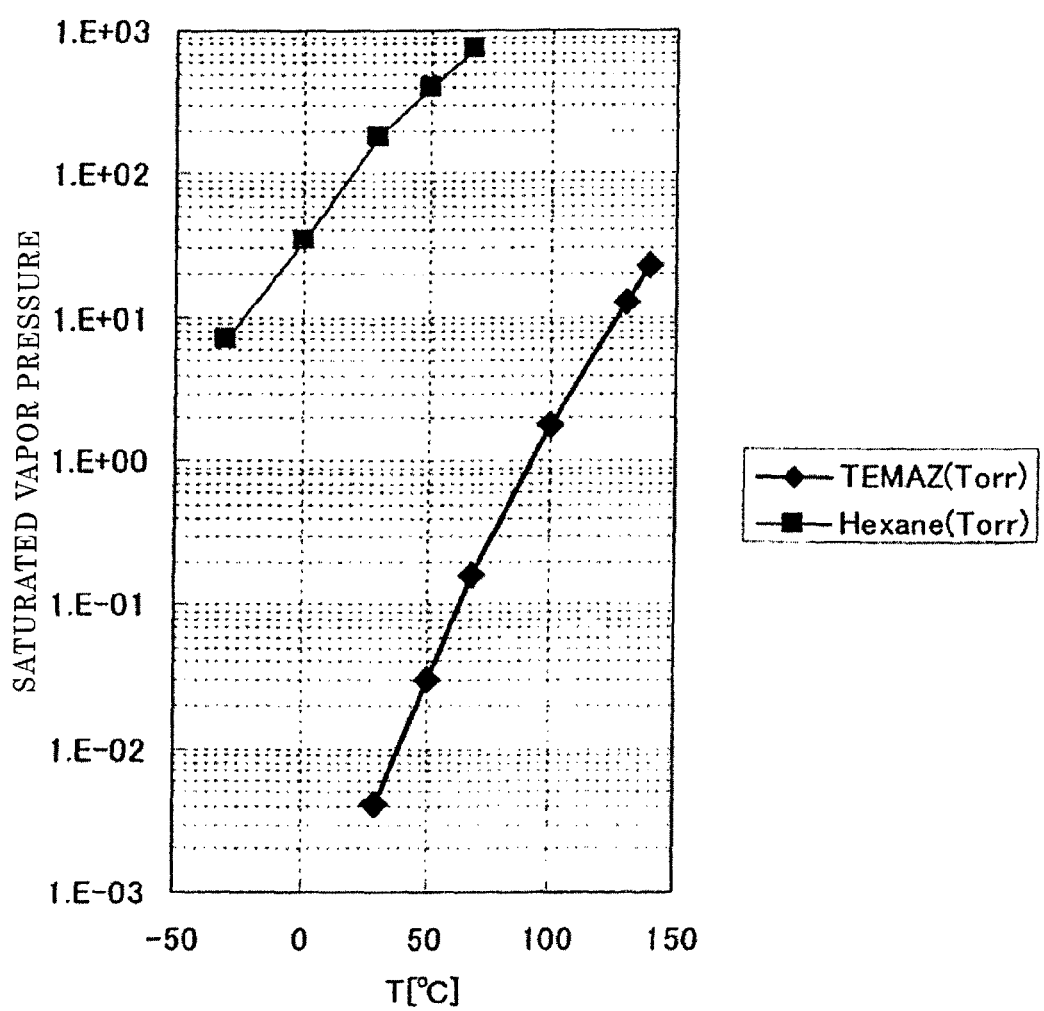
FIG. 6 is a graph illustrating a saturated vapor pressure curve of the TEMAZ and n-Hexane.

Hereinafter, with referent to a flow chart illustrated in FIG. 5, a process for confirming the liquid mass flow controller 35 will be described.

STEP:11

When operation confirmation processing starts by a command transmitted from the controller 57, the controller 57 operates the vacuum pump 55 first, and the valves c and e are opened so as to depressurize the inside of the pipe in a region surrounded by the valves b, d, f, and j and the vacuum pump 55.

STEP:12

When the depressurization of the inside of the pipe is completed, the valves c and e are closed, and the valve a is opened to supply the pressurizing inert gas into the solvent tank 61 so as to boost a pressure inside the solvent tank 61.

STEP:13

After the pressure inside the solvent tank is boosted, the valves b, c, and e are opened, and a flowrate set valve (threshold) of the liquid mass flow controller 35 is inputted from the controller 57. Then, the solvent is supplied from the solvent tank 61 to the liquid mass flow controller 35 by disposing the valves b and c therebetween, and the solvent supplied into the liquid mass flow controller 35 is exhausted to the outside of the substrate processing apparatus 1 by disposing the valve e and the vacuum pump 55 therebetween.

STEP:14

At this time, the solvent flowrate controlled by the liquid mass flow controller 35 is fed back to the controller 57, and the controller 57 compares the feed back value to the preset value (for example, 0.5 g) to determine whether the solvent flows according to the preset value. Whether the solvent flows actually into the liquid mass flow controller 35 or whether the solvent flowrate can be controlled is confirmed, and when it is determined that the liquid mass flow controller 35 is normally operated, the solvent is removed. Then, by appropriately adjusting the supply and vacuum exhaust of the inert gas such as $N_2$, the inside of the process chamber 31 is purged, and also, by supplying the liquid source into the liquid mass flow controller 35, the film forming processing of the wafers 2 is performed.

Also, when it is determined that the solvent does not flow according to the preset value, the solvent flowrate cannot be controlled, and the liquid mass flow controller 35 is defective, the film forming processing is stopped. Then, replacement and repair works of the liquid mass flow controller 35 are performed.

Also, the operation of the liquid mass flow controller 35 may be directly confirmed by a worker through a screen of the controller 57, or may be confirmed by the controller 57. In addition, an alarming part (not shown) is added to the controller 57, and in case where the liquid mass flow controller 35 is abnormally operated, by informing an alarm message such as generation of sound by the alarming part, display on the screen, or lighting of an alarm light such as a patrol car light to the worker, its purpose may be notified.

When the film forming of the wafers 2 is performed, the liquid source inside the liquid source tank 59 is transferred to the vaporizer 36 via the liquid mss flow controller 35, and then, after the liquid source is vaporized by the vaporizer 36, the liquid source is supplied into the process chamber 31 by disposing the valve h therebetween so as to contribute the film forming of the wafers 2. After the films are formed on the wafers 2, the vaporizer liquid source is exhausted from the gas exhaust pipe 53 by disposing the vacuum pump 55 therebetween.

When the film forming process is formed for a predetermined time, by-products are generated within the vaporizer 36. At this time, the solvent inside the solvent tank 61 may be used as a cleaning solution for cleaning the inside of the vaporization 36.

When the cleaning process is performed, according to a command transmitted from the controller 57, all of the valves a to j are closed, and then, the valves e and f are opened. The liquid source remaining within the pipe in a region surrounded by the valves c, d, g, h, and j is exhausted by disposing the vacuum pump 55 so as to make the inside of the pipe in a vacuum state.

Next, by opening the valve j, the inside of the pipe is purged by the pressurizing inert gas, and then, the purge process is finished. Then, the valve j is closed to make the inside of the pipe in the vacuum state.

Next, the valves a and b are opened, and the solvent is introduced into the vaporizer 36 by the effect of the pressurizing inert gas. After a predetermined time elapses, by closing the valves a and b and opening the valves g and j, the by-products within the vaporizer 36 may be removed. Finally, by closing the valves g and j and opening the valves e and f, the inside of the pie may be depressurized and the solvent remaining in the pipe may be removed. At this time, since the material remaining in the pipe is a high volatile solvent such as n-Hexane and the like, even though the solvent remaining in the pipe is not completely removed only by the purge using the pressurizing inert gas and the decompression using the vacuum pump 55, the solvent is vaporized, and thus does not remain in the pipe.

As described above, using the high volatile solvent which does not remain in the pipe, since the operation of the liquid mass flow controller 35 or the liquid flowmeter is confirmed before the film forming processing, the processes such as the liquid removal process→the purge process→the cleaning process using the solvent→the purge process, which are required when the defects of the liquid mass flow controller 35 or the liquid flowmeter are detected are unnecessary during the film forming processing. Thus, the work time may be significantly reduced, and simultaneously, it may prevent members such as the pipe from being contaminated by reaction between the residual liquid source and the atmosphere during the replacement works.

Also, since the pipe and the vaporizer 36 may be cleaned using the solvent, a system for supplying a new cleaning solution is not required, and thus, manufacturing costs may be reduced.

In the current embodiment, the operation confirmation of the liquid mass flow controller 35 is mainly performed when initially adjusted. Particularly, in the film forming process (for example, high-k film forming process) which cannot be stopped when once the liquid source flows, the operation confirmation is not performed in timing except the initial adjustment. In the film forming process, the supply of the liquid source corresponds to the operation confirmation of the liquid mass flow controller 35, and in the step in which the defects of the liquid mass flow controller 35 are detected, the processing is stopped, and then, the liquid mass flow controller 35 is replaced.

Also, the present invention is not limited to the $ZrO_2$ film forming, and as a kind of films formed using a liquid source having a low vapor pressure, the present invention can be applied to other kinds of films formed using the vaporizer and the mass flow controller.

According to the conditions of applicable solvent, organic solvents having a vapor pressure greater than that of the liquid source can be applied, and preferably, high volatile solvents can be applied. The combination of the solvents can be changed by kinds of the liquid source. For example, in relation to TEMAZ and TEMAH, material such as octane having the different number of atoms of carbon can be applied, and also, material such as hexane containing six carbon atoms in a chain, haxtane containing seven carbon atoms in a chain, and octane containing eight carbon atoms in a chain can be applied.

According to the present invention, the substrate processing apparatus includes: a process chamber receiving a substrate; a liquid source supply system supplying a liquid source which is a liquid at room temperature and atmospheric pressure into the process chamber; a solvent supply system supplying a solvent having a vapor pressure greater than that of the liquid source into the process chamber; a liquid flowrate control device controlling flowrates of the liquid source and the solvent; and a controller controlling the liquid source supply system, the solvent supply system, and the liquid flowrate control device. Here, the controller controls the liquid source supply system, the solvent supply system, and the liquid flowrate control device so that the solvent is supplied into the liquid flowrate control device than the solvent supply system to confirm an operation of the liquid flowrate control device before the liquid source supply system supplies the liquid source into the process chamber by disposing the liquid flowrate control device therebetween. Thus, the processes required when defects of the liquid flowrate control device are detected or the liquid flowrate control device is replaced can be significantly reduced, and simultaneously, the contamination due to the reaction between the residual source and the atmosphere during the replacement works can be prevented.

According to the present invention, the substrate processing apparatus is configured to supply the liquid source into the process chamber to form a film on the substrate, and the controller includes: a measuring part monitoring the liquid flowrate control device to measure a flowrate of the solvent flowing into the liquid flowrate control device; and a comparing part comparing the measured flowrate of the solvent to a predetermined threshold value. Here, when the flowrate of the solvent is in a range of the predetermined threshold value, the solvent is removed from the process chamber, and the liquid source is supplied to form the film on the substrate. Thus, it can prevent the liquid source from flowing in a state where the defects of the liquid flowrate control device occur, and also prevent time and labor required during the replacement works from being increased.

According to the present invention, the substrate processing apparatus includes: a process chamber receiving a substrate; a source supply system supplying a vaporized gas formed by vaporizing a liquid source which is a liquid at room temperature and atmospheric pressure using a vaporizer into the process chamber; a reaction gas supply system supplying an reaction gas reacting with the vaporized gas into the process chamber; a solvent supply system supplying a solvent having a vapor pressure greater than that of the vaporized gas into the process chamber; a liquid flowrate control device controlling flowrates of the liquid source and the solvent; and a controller controlling the source supply system, the reaction gas supply system, the solvent supply system, and the liquid flowrate control device. Here, the controller controls the source supply system, the reaction gas supply system, the solvent supply system, and the liquid flowrate control device so that the solvent is supplied into the liquid flowrate control device than the solvent supply system to confirm an operation of the liquid flowrate control device before the source supply system supplies the liquid source into the process chamber by disposing the liquid flowrate control device therebetween. In addition, the controller alternately supplies the vaporized gas and the reaction gas after confirming the operation of the liquid flowrate control device to form the film on the substrate. Thus, the processes required when the liquid flowrate control device is replaced can be significantly reduced, and simultaneously, it can prevent the liquid source from flowing in a state where the defects of the liquid flowrate control device occur, and also prevent time and labor required during the replacement works from being increased.

According to the present invention, the method of manufacturing the semiconductor device includes: supplying a solvent into a liquid flowrate control device connected to a process chamber; monitoring the liquid flowrate control device to measure a flowrate of the solvent flowing into the liquid flowrate control device; comparing the measured flowrate of the solvent to a predetermined threshold value; removing the solvent from the process chamber when the flowrate of the solvent is in a range of the predetermined threshold value; vaporizing a liquid source supplied by disposing the liquid flowrate control device to supply the vaporized gas into the process chamber; and alternately supplying an reaction gas reacting with the vaporized gas to form a predetermined film on a surface of a substrate placed in the process chamber. Thus, the processes required when the liquid source flows in the state where the defects of the liquid flowrate control device occur to replace the liquid flowrate control device can be significantly reduced.

According to the present invention, the method of confirming the operation of the liquid flowrate control device includes: supplying a solvent into a liquid flowrate control device connected to a process chamber; monitoring the liquid flowrate control device to measure a flowrate of the solvent flowing into the liquid flowrate control device; comparing the measured flowrate of the solvent to a predetermined threshold value; and removing the solvent from the process chamber when the flowrate of the solvent is in a range of the predetermined threshold value. Thus, the defects of the liquid flowrate control device can be easily detected, and the processes required when the liquid flowrate control device is replaced can be significantly reduced, and simultaneously, the contamination due to the reaction between the residual source and the atmosphere during the replacement works can be prevented.

(Supplementary Note)

The present invention also includes the following embodiments.

(Supplementary Note 1)

According to an embodiment of the present invention, there is provided a substrate processing apparatus comprising:

a process chamber accommodating a substrate;

a liquid source supply system supplying a liquid source which is a liquid at room temperature and atmospheric pressure into the process chamber;

a solvent supply system supplying a solvent having a vapor pressure greater than that of the liquid source into the process chamber;

a liquid flowrate control device controlling flowrates of the liquid source and the solvent; and a controller controlling the liquid source supply system, the solvent supply system, and the liquid flowrate control device, wherein the controller controls the liquid source supply system, the solvent supply system, and the liquid flowrate control device so that the solvent is supplied into the liquid flowrate control device than the solvent supply system to confirm an operation of the liquid flowrate control device before the liquid source supply system supplies the liquid source into the process chamber by disposing the liquid flowrate control device therebetween.

(Supplementary Note 2)

The substrate processing apparatus may be configured to supply the liquid source into the process chamber to form a film on the substrate, and the controller may comprise:

a measuring part monitoring the liquid flowrate control device to measure a flowrate of the solvent flowing into the liquid flowrate control device; and a comparing part comparing the measured flowrate of the solvent to a predetermined threshold value, wherein, when the flowrate of the solvent is in a range of the predetermined threshold value, the solvent may be removed from the process chamber, and the liquid source may be supplied to form the film on the substrate of Supplementary Note 1.

(Supplementary Note 3)

In the substrate processing apparatus of Supplementary Note 2, when the flowrate of the solvent is out of the range of the predetermined threshold value, the solvent may be removed from the process chamber, and maintenance of the flowrate control device may be performed.

(Supplementary Note 4)

In the substrate processing apparatus of Supplementary Note 2, the control may comprise an alarming part and inform an alarm message through the alarming part when the flowrate of the solvent is out of the range of the predetermined threshold value.

(Supplementary Note 5)

In the substrate processing apparatus of Supplementary Note 4, the alarm message may comprise one of sound, display on a screen, and lighting of an alarm light.

(Supplementary Note 6)

In the substrate processing apparatus of Supplementary Note 1, the operation confirmation of the liquid flowrate control device may be performed when initially adjusted or the liquid flowrate control device is replaced.

(Supplementary Note 7)

According to another preferred embodiment of the present invention, there is provided a method of manufacturing a semiconductor device, the method comprising:

supplying a solvent into a liquid flowrate control device connected to a process chamber;

monitoring the liquid flowrate control device to measure a flowrate of the solvent flowing into the liquid flowrate control device;

comparing the measured flowrate of the solvent to a predetermined threshold value;

removing the solvent from the process chamber when the flowrate of the solvent is in a range of the predetermined threshold value;

vaporizing a liquid source supplied by disposing the liquid flowrate control device to supply the vaporized gas into the process chamber; and alternately supplying an reaction gas reacting with the vaporized gas to form a predetermined film on a surface of a substrate placed in the process chamber.

(Supplementary Note 8)

According to another preferred embodiment of the present invention, there is provided a method of confirming an operation of a liquid flowrate control device, the method comprising:

supplying a solvent into a liquid flowrate control device connected to a process chamber;

monitoring the liquid flowrate control device to measure a flowrate of the solvent flowing into the liquid flowrate control device;

comparing the measured flowrate of the solvent to a predetermined threshold value; and removing the solvent from the process chamber when the flowrate of the solvent is in a range of the predetermined threshold value.

What is claimed is:

1. A method of method of manufacturing a semiconductor device, the method comprising:

supplying a solvent into a liquid flowrate control device connected to a process chamber;

monitoring the liquid flowrate control device to measure a flowrate of the solvent flowing into the liquid flowrate control device;

comparing the measured flowrate of the solvent to a predetermined threshold value;

removing the solvent from the process chamber when the flowrate of the solvent is in a range of the predetermined threshold value;

vaporizing a liquid source supplied by disposing the liquid flowrate control device to supply the vaporized gas into the process chamber; and alternately supplying an reaction gas reacting with the vaporized gas to form a predetermined film on a surface of a substrate placed in the process chamber.

* * * * *